United States Patent
Nomura et al.

(10) Patent No.: US 8,455,419 B2
(45) Date of Patent: Jun. 4, 2013

(54) PHOTORESIST STRIPPING AGENT COMPOSITION

(75) Inventors: Toshihiro Nomura, Niigata-Ken (JP); Masahide Matsubara, Tokyo-To (JP); Seiji Naito, Niigata-Ken (JP); Takashi Nakamura, Niigata-Ken (JP); Yuuichi Sugano, Niigata-Ken (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 76 days.

(21) Appl. No.: 13/297,518

(22) Filed: Nov. 16, 2011

(65) Prior Publication Data

US 2012/0149622 A1      Jun. 14, 2012

(30) Foreign Application Priority Data

Nov. 24, 2010   (JP) .................................. 2010-261376

(51) Int. Cl.
*C11D 7/50* (2006.01)
*C11D 11/00* (2006.01)

(52) U.S. Cl.
CPC .................................. *C11D 11/0047* (2013.01)
USPC ............................. 510/175; 510/176; 134/1.3

(58) Field of Classification Search
USPC .................................. 510/175, 176; 134/1.3
See application file for complete search history.

(56) References Cited

U.S. PATENT DOCUMENTS

| | | | | |
|---|---|---|---|---|
| 5,567,574 | A * | 10/1996 | Hasemi et al. | 430/331 |
| 6,440,326 | B1 * | 8/2002 | Maruyama et al. | 252/79.1 |
| 6,458,517 | B2 * | 10/2002 | Nohara et al. | 430/329 |
| 7,176,173 | B2 * | 2/2007 | Takashima | 510/175 |
| 7,396,806 | B2 * | 7/2008 | Sakai et al. | 510/175 |
| 7,879,784 | B2 * | 2/2011 | Shirota | 510/176 |
| 8,007,593 | B2 * | 8/2011 | Miyamoto et al. | 134/1 |
| 2003/0186175 | A1 * | 10/2003 | Ikemoto et al. | 430/331 |
| 2009/0137439 | A1 * | 5/2009 | Dinh et al. | 510/170 |
| 2011/0206829 | A1 * | 8/2011 | Lee et al. | 427/8 |

* cited by examiner

Primary Examiner — Gregory Webb
(74) Attorney, Agent, or Firm — Oblon, Spivak, McClelland, Maier & Neustadt, L.L.P.

(57) ABSTRACT

Disclosed is a stripping agent that can easily strip a photoresist residue and the like at a low temperature in a short time and, at the same time, does not corrode a wiring material at all and has no need to use an organic solvent such as alcohol as a rinsing liquid. The stripping agent disclosed herein comprises 5 to 50% by mass of a specific amine, 30 to 65% by mass of a specific acid amide, 0.1 to 15% by mass of a saccharide or a sugar alcohol, and 1 to 64.5% by mass of water.

8 Claims, 1 Drawing Sheet

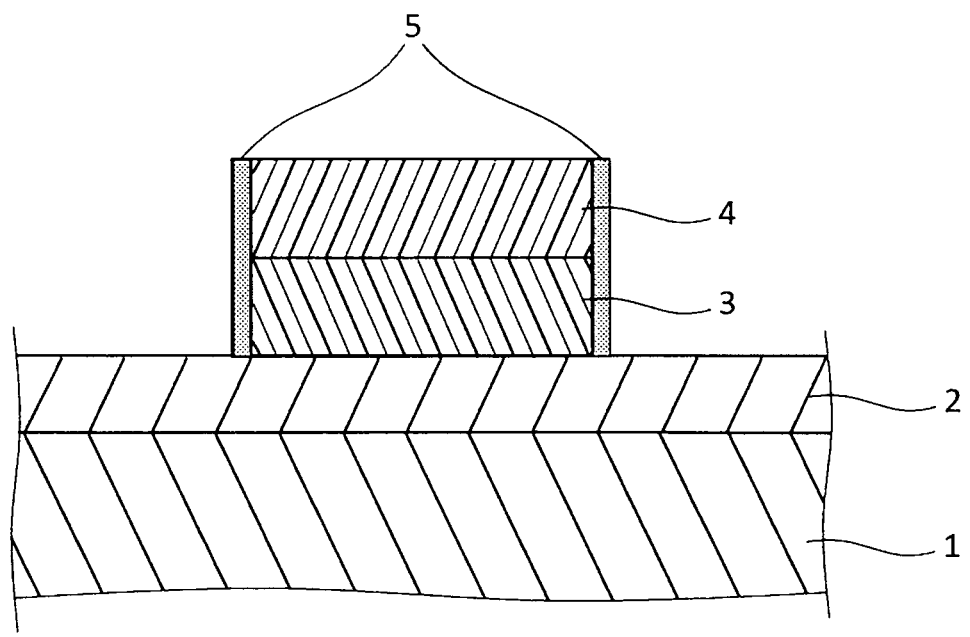

PHOTORESIST STRIPPING AGENT COMPOSITION

RELATED APPLICATION

This application is based upon and claims the benefit of priority from the prior Japanese Patent Applications No. 261376/2010, filed on Nov. 24, 2010, the entire contents of which are incorporated herein by reference.

BACKGROUND OF THE INVENTION

1. Field of the Invention

The present invention relates to a stripping agent composition for photoresist layer stripping used in a method for manufacturing a semiconductor integrated circuit, and a photoresist stripping method using the stripping agent composition.

2. Background Art

Semiconductor integrated circuits are manufactured by coating a photoresist on an inorganic base, exposing the photoresist to light, developing the exposed photoresist to form a pattern, then providing the patterned photoresist as a mask, etching the inorganic base in its non-mask area to form a fine circuit using the mask, and stripping the photoresist film (mask) from the inorganic base. The photoresist film is stripped with a stripping agent or by ashing the photoresist film and then removing the resist residue remaining unremoved from the inorganic base with the stripping agent.

A stripping agent comprising an ethylene oxide adduct of an alkanolamine or a polyalkylene polyamine, a sulfone compound, and a stripping agent comprising a glycol monoalkyl ether (Japanese Patent Publication No. 12455/1994) or a stripping agent comprising dimethyl sulfoxide as a main component and a diethylene glycol monoalkyl ether and a nitrogen-containing organic hydroxy compound (Japanese Patent No. 2578821) has hitherto been used as the stripping agent for the removal of the photoresist film or for the removal of photoresist residue and the like.

In the stripping agent, however, the amine dissociates with moisture absorbed in use, and, as a result, the stripping agent is rendered alkaline. The alkaline stripping agent is highly corrosive against aluminum, copper or the like which is a wiring material. When the base is rinsed with water after stripping the resist, the stripping agent remaining on the base is miscible with water to render the stripping agent strongly alkaline. Accordingly, aluminum, copper and the like which are wiring materials are disadvantageously corroded. In circuit boards in recent years, due to ultrafine interconnection, the dimensional accuracy requirement is strict, and, thus, the corrosion of the wiring material is unfavorable. Accordingly, when the alkaline stripping agent is used, in order to completely remove the remaining stripping agent, rinsing with an organic solvent such as alcohol is necessary, leading to a problem such as complication of the process.

In addition, water-free organic amine stripping agents are disclosed (Japanese Patent Publication No. 82238/1995 and Japanese Patent No. 3095296). However, these organic amine stripping agents are sometimes poor in the power of stripping the resist film after etching or stripping the resist residue after ashing. Further, in some cases, dry etching renders the surface of the resist film hard. In the organic amine stripping agents, however, the resultant hard resist film cannot be completely removed without difficulties. Furthermore, the composition of the resist residue produced by etching or plasma ashing is also complicated. In the organic amine stripping agents, the removal of the resist film or the resist residue is unsatisfactory. Further, when dry etching is adopted as the etching, due to mutual action among the gas, resist, and various inorganic materials used in the dry etching, a side-wall polymer which is a kind of resist residue is produced. Also for the side-wall polymer, the conventional organic amine stripping agent has poor stripping power.

On the other hand, water-containing alkanolamine stripping agents are disclosed (Japanese Patent Publication Nos. 69618/1995 and 69619/1995 and Japanese Patent No. 3048207). Even the water-containing alkanolamine stripping agents, however, do not offer a satisfactory effect in removing the resist film or removing the resist residue.

Accordingly, a photoresist stripping agent composition that can easily strip the above photoresist residue and the like at a low temperature in a short time, does not corrode the wiring material at all, and can be rinsed with water alone has been desired. Regarding the above stripping agent, for example, Japanese Patent Laid-Open No. 190205/1996 proposes a photoresist stripping agent composition comprising 5 to 50% of an alkanolamine compound, an alkoxyalkylamine compound, or an alkoxyalkanolamine compound, 1 to 30% of a glycol monoalkyl ether, and 0.5 to 15% of a saccharide or a sugar alcohol with the balance consisting of water. Further, Japanese Patent Laid-Open No. 202051/1996 proposes a photoresist stripping agent composition comprising 5 to 50% of an alkanolamine compound, alkoxyalkylamine compound or an alkoxyalkanolamine compound, 1 to 30% of an acid amide, and 0.5 to 15% of a saccharide or a sugar alcohol with the balance consisting of water. These stripping agents, however, have an unsatisfactory stripping speed. Resist stripping agents comprising an amine containing an n-hydroxymethyl group (Japanese Patent No. 4224651) and stripping agents comprising a combination of an amine compound, a specific aldehyde compound, and an aromatic hydroxy compound (Japanese Patent No. 4320865) are also proposed. These resist stripping agents, however, are poor in safety and stability of compounds.

SUMMARY OF THE INVENTION

The present inventors have now found that a stripping agent composition comprising a specific acid amide, an alkanolamine compound, an alkoxyalkylamine compound, or an alkoxyalkanolamine compound, a saccharide or a sugar alcohol, and water can easily strip a photoresist film coated onto an inorganic base, a photoresist layer which remains after dry etching of the photoresist film, a photoresist residue which remains upon ashing after dry etching, or the like at a low temperature in a short time, and, at the same time, does not corrode a wiring material at all, can eliminate the need to use an organic solvent such as alcohol as a rising liquid, and can simply manufacture a circuit wiring with high accuracy by rinsing with water only. The present invention has been made based on such finding.

Accordingly, an object of the present invention is to provide a photoresist stripping agent composition that can easily strip a photoresist film coated onto an inorganic base, a photoresist layer which remains after dry etching of the photoresist film, a photoresist residue which remains upon ashing after dry etching, or the like at a low temperature in a short time, and, at the same time, does not corrode a wiring material at all, can eliminate the need to use an organic solvent such as alcohol as a rising liquid, and can simply manufacture a circuit wiring with high accuracy by rinsing with water only.

According to one aspect of the present invention, there is provided a photoresist stripping agent composition comprising at least: an amine; an acid amide; a saccharide or a sugar alcohol; and water, said amine comprising at least one compound selected from the group consisting of alkanolamines, alkoxyalkylamines, and alkoxyalkanolamines, said acid amide being represented by formula (I)

$(CH_3)_2C(R_1)CON(R_2)(R_3)$          (I)

wherein $R_1$ represents hydrogen or a hydroxyl group; and $R_2$ and $R_3$ each independently represent a C1-C4 alkyl group, the content of said amine is 5 to 50% by mass based on the whole composition, the content of said acid amide is 30 to 65% by mass based on the whole composition, the content of said saccharide or the sugar alcohol is 0.1 to 15% by mass based on the whole composition, and the content of water is 1 to 64.5% by mass based on the whole composition.

According to another aspect of the present invention, there is provided a method for stripping a photoresist, the method comprising stripping a photoresist with the above photoresist stripping agent composition.

The present invention can realize easy stripping of a photoresist film coated onto an inorganic base, a photoresist layer which remains after dry etching of the photoresist film, a photoresist residue which remains upon ashing after dry etching, or the like at a low temperature in a short time, and, at the same time, can completely prevent corrosion of a wiring material, can eliminate the need to use an organic solvent such as alcohol as a rising liquid, and can simply manufacture a circuit wiring with high accuracy by rinsing with water only. The photoresist stripping agent composition according to the present invention is suitable particularly for the whole field of electronic materials having an aluminum wiring.

BRIEF DESCRIPTION OF THE DRAWING

FIG. 1 is a cross-sectional view of a semiconductor device manufactured by performing dry etching using a resist film as a mask and forming an aluminum wiring body.

DETAILED DESCRIPTION OF THE INVENTION

The photoresist stripping agent composition according to the present invention comprises an amine, an acid amide, a saccharide or a sugar alcohol, and water as indispensable components. Individual components constituting the photoresist stripping agent composition according to the present invention will be described.

<Amines>

The amine used in the present invention is at least one compound selected from the group consisting of alkanolamines, alkoxyalkylamines, and alkoxyalkanolamines. Such amines include, for example, ethanolamine, N-methylethanolamine, N,N-dimethylethanolamine, N-ethylethanolamine, N,N-diethylethanolamine, propanolamine, N-methylpropanolamine, N,N-dimethylpropanolamine, N-ethylpropanolamine, N,N-diethylpropanolamine, 2-methoxyethylamine, 2-ethoxyethylamine, 3-methoxypropylamine, 3-ethoxypropylamine, 2-(2-aminoethoxy)ethanol, 2-(2-aminoethoxy)propanol, 2-amino-1-propanol, and 1-amino-2-propanol. Among them, ethanolamine, N-methylethanolamine, and 2-(2-aminoethoxy)ethanol are preferred. The amines are may be used either solely or in a combination of two or more of them.

The content of the amine is 5 to 50% by mass based on the whole composition, preferably 10 to 40% by mass, more preferably 10 to 35% by mass. When the content of the amine falls within the above-defined range, the corrosion of the wiring material can be suppressed while maintaining a high level of stripping speed of photoresist.

<Acid Amides>

The acid amides usable in the present invention are represented by formula (I).

$(CH_3)_2C(R_1)CON(R_2)(R_3)$          (I)

wherein $R_1$ represents hydrogen or a hydroxyl group; and $R_2$ and $R_3$ each independently represent a C1-C4 alkyl group.

$R_2$ and $R_3$ in formula (I) are preferably selected from the group consisting of methyl, ethyl, i-propyl, n-propyl, i-butyl, n-butyl, and t-butyl groups.

Acid amides represented by formula (I) include, for example, N,N-dimethylisobutylamide, N-ethyl, N-methylisobutylamide, N,N-diethylisobutylamide, 2-hydroxy-N,N,2-trimethylpropanamide, N-ethyl-2-hydroxy-N,2-dimethylpropanamide, and N,N-diethyl-2-hydroxy-2-methylpropanamide. Among them, N,N-dimethylisobutylamide, N-ethyl, N-methylisobutylamide, 2-hydroxy-N,N,2-trimethylpropanamide, and N-ethyl-2-hydroxy-N,2-dimethylpropanamide are preferred. In particular, N,N-dimethylisobutylamide, and 2-hydroxy-N,N,2-trimethylpropanamide are preferred. The acid amides may be used either solely or a proper combination of two or more of them.

The content of the amine is 30 to 65% by mass, preferably 35 to 60% by mass, more preferably 35 to 55% by mass, based on the whole composition.

The photoresist stripping agent composition according to the present invention may comprise an acid amide other than the acid amides represented by formula (I). Acid amides other than the acid amides represented by formula (I) include: formamides such as formamide, N-methylformamide, N-ethylformamide, N,N-dimethylformamide, and N,N-diethylformamide; acetamides such as acetamide, N-methylacetamide, N-ethylacetamide, N,N-dimethylacetamide, and N,N-diethylacetamide; and N-methylpyrrolidone, N-ethylpyrrolidone, N-propylpyrrolidone, and N-butylpyrrolidone. The acid amides may be used either solely or a proper combination of two or more of them.

The content of the acid amides other than the acid amides represented by formula (I) is preferably not more than 40% by mass based on the whole composition. Further, the total content of the acid amide represented by formula (I) and the acid amide other than the acid amides represented by formula (I) is preferably 30 to 70% by mass. When the content of the acid amide falls within the above-defined range, the corrosion of the aluminum wiring material can be suppressed while maintaining a high level of stripping speed of the photoresist.

<Saccharide or Sugar Alcohol>

Saccharides usable in the present invention include saccharides such as monosaccharides and polysaccharides. Specific examples thereof include glycerin aldehyde having 3 to 6 carbon atoms, threose, arabinose, xylose, ribose, ribulose, xylulose, glucose, mannose, galactose, tagatose, allose, altrose, gulose, idose, talose, sorbose, psicose, and fructose. Sugar alcohols include, for example, threitol, erythritol, adonitol, arabitol, xylitol, talitol, sorbitol, mannitol, iditol, and dulcitol. Among them, glucose, mannose, galactose, sorbitol, mannitol, xylitol and the like are preferred, for example, from the viewpoint of solubility or degradability.

The content of the saccharide or the sugar alcohol is 0.1 to 15% by mass, preferably 1 to 10% by mass, based on the whole composition. When the content of the saccharide or the sugar alcohol is less than 0.1% by mass, the corrosion of the wiring material cannot be satisfactorily prevented. On the other hand, when the content exceeds 15% by mass, the corrosion resistance is not improved, leading to an increase in production cost of the photoresist stripping agent composition.

<Water>

The photoresist stripping agent composition according to the present invention comprises 1 to 64.5% by mass, based on the whole composition, of water as the solvent in addition to the above components. Water is preferably pure water or ultrapure water such as ion-exchanged water, ultrafiltered water, reverse osmosed water, or distilled water.

<Method for Stripping Photoresist>

The method for stripping a photoresist according to the present invention comprises stripping a photoresist with the above photoresist stripping agent composition. The photoresist stripping agent composition can be applied by any method without particular limitation. The so-called "dipping method" is generally adopted in which a photoresist is immersed in the photoresist stripping agent composition. Alternatively, a method may be adopted in which the photoresist stripping agent composition is sprayed on the photoresist. Further, in stripping, if necessary, proper heating or the combined use of the stripping agent composition and ultrasonic waves or the like is possible. After the application of the photoresist stripping agent composition to the photoresist it is followed by rinsing with water.

FIG. 1 is a cross-sectional view of a semiconductor device formed by performing dry etching using a resist film as a mask and forming an aluminum wiring body. The semiconductor device comprises an oxide film 2 provided on an inorganic base 1, a patterned aluminum wiring body 3 provided on the oxide film 2, and a resist film 4 provided on the aluminum wiring body 3. Further, a residue 5 (a side wall polymer) produced in the formation of an aluminum wiring body 3 by dry etching is formed on a side surface of the aluminum wiring body 3 and the resist film 4. A laminate film of titanium/titanium nitride (not shown) may be provided on an upper surface and a lower surface of the aluminum wiring body 3.

Inorganic bases usable herein include semiconductor wiring materials such as silicon, amorphous silicon, polysilicon, silicon oxide films, silicon nitride films, aluminum, aluminum alloys, titanium, titanium tungsten, titanium nitride, tungsten, tantalum, tantalum compounds, chromium, chromium oxides, chromium alloys, and ITO (indium-tin compounds), compound semiconductors such as gallium-arsenic, gallium-phosphorus, and indium-phosphorus, and glass substrates for LCDs.

Aluminum wiring materials include aluminum and aluminum copper alloys having an aluminum content of not less than 95%.

According to the method for stripping a photoresist according to the present invention, in the semiconductor device, it is possible to remove not only the resist film 4 but also a photoresist layer remaining unremoved on the inorganic base after dry etching, a photoresist residue produced by ashing after dry etching, and the side wall polymer 5. Further, the present invention is advantageous in that, after the treatment with the stripping agent, there is no need to perform rinsing with an organic solvent such as alcohol and what is required is only to perform rinsing with water.

EXAMPLES

The present invention is further illustrated by the following Examples and Comparative Examples that are not intended as a limitation of the invention.

<Preparation of Stripping Agent>

Stripping agents were prepared by mixing individual components together according to formulations shown in Table 1 below. In the table, numeral values are % by weight. Further, in the table, DMIB represents N,N,-dimethylisobutylamide, DMHB represents 2-hydroxy-N,N,2-trimethylpropanamide, DMAC represents N,N-dimethylacetamide, and NMP represents N-methylpyrrolidone.

TABLE 1

| Formulation | | 1 | 2 | 3 | 4 | 5 | Comparative Example 1 | Comparative Example 2 |
|---|---|---|---|---|---|---|---|---|
| N-Methylethanolamine | | 15 | 15 | 15 | 15 | 20 | 15 | 15 |
| Acid amide | DMIB | 50 | — | 30 | — | 40 | — | — |
| | DMHB | — | 50 | — | 40 | — | — | — |
| | DMAC | — | — | 20 | 10 | — | 50 | 45 |
| | NMP | — | — | — | — | — | — | 5 |
| Sorbitol | | 5 | 5 | 5 | 5 | 10 | 5 | 5 |
| Water | | 30 | 30 | 30 | 30 | 30 | 30 | 30 |

<Evaluation>

Evaluation Method A (Stripping Time and Residual Ratio of Acid Amide)

(1) Stripping Time

A positive-type photoresist was coated onto a 1.0 mm-thick silicon wafer having a diameter of 6 inches (about 15 cm) to a thickness of 1.4 µm, and the coating was baked at 180° C. for 5 min. Thereafter, the photoresist stripping agent shown in Table 1 was heated to 40° C., and the silicon wafer was dipped in the heated photoresist stripping agent for a predetermined period of time. After washing with pure water, whether or not the resist is present was visually observed, and the period of time until the resist was no longer observed was regarded as a resist stripping capability.

(2) Acid Amide Residual Ratio

The photoresist stripping agent (50 g) used in the evaluation of the thermal stability of the acid amide was heated at 80° C. for 8 hr, and the amount of the acid amide was determined by gas chromatography to determine the residual ratio of the acid amide from the initial state. The residual ratio was regarded as a residual ratio after heating at 80° C.

Evaluation Method B (Strippability and Corrosion Test)

The structure of the semiconductor device substrate used in the evaluation is shown in FIG. 1. An oxide film 2 as an underlayer, titanium, aluminum, and titanium were sputtered in that order for film formation on a silicon semiconductor substrate. Thereafter, a resist film 4 was provided as a mask. Thereafter, dry etching was performed with $Cl_2/BCl_3$ gas to form an aluminum wiring body 3.

As shown in FIG. 1, a semiconductor device substrate 1 was covered with an oxide film 2, and a side-wall protective film 5 was formed at the time of dry etching. The semiconductor device shown in FIG. 1 was dipped in the stripping agent, obtained above, at 50° C. for 2.5 min, was then rinsed with ultrapure water, was dried, and was observed under an electron microscope (SEM: Hitachi S-4700, acceleration voltage 5 kV, magnification 15000 times). The strippability of the resist film 4 and the side-wall protective film 5 and the corrosiveness of the aluminum wiring body 3 were evaluated. The corrosion of the titanium layer was not found.

The criteria of evaluation by SEM observation were as follows.

(Stripped State)

4: Completely removed

3: Substantially completely removed

2: The film(s) partially remained unremoved
1: The film(s) mostly remained unremoved
(Corroded State)
4: Corrosion not found at all
3: Corrosion hardly found
2: Corrosion in a crater or pit state found
1: Severe roughening found.
The evaluation results were as shown in Table 2 below.

TABLE 2

| | Evaluation method A | | Evaluation method B | | |
|---|---|---|---|---|---|
| | Necessary Stripping time (sec) | Residual ratio of acid amide (%) | Strippability | | |
| | | | Resist film | Residue | Corrosiveness |
| Ex. 1 | 30 | >99 | 4 | 4 | 4 |
| Ex. 2 | 210 | >99 | 4 | 3 | 4 |
| Ex. 3 | 60 | >99 | 4 | 4 | 4 |
| Ex. 4 | 220 | >99 | 4 | 3 | 4 |
| Ex. 5 | 50 | >99 | 4 | 4 | 4 |
| Comp. Ex. 1 | 270 | >99 | 4 | 2 | 4 |
| Comp. Ex. 2 | 270 | >99 | 4 | 2 | 4 |

What is claimed is:

1. A photoresist stripping agent composition comprising at least: an amine; an acid amide; a saccharide or a sugar alcohol; and water,
said amine comprising at least one compound selected from the group consisting of alkanolamines, alkoxyalkylamines, and alkoxyalkanolamines,
said acid amide being represented by formula (I)

$$(CH_3)_2C(R_1)CON(R_2)(R_3) \qquad (I)$$

wherein $R_1$ represents hydrogen or a hydroxyl group; and $R_2$ and $R_3$ each independently represent a C1-C4 alkyl group,
the content of said amine is 5 to 50% by mass based on the whole composition,
the content of said acid amide is 30 to 65% by mass based on the whole composition,
the content of said saccharide or said sugar alcohol is 0.1 to 15% by mass based on the composition, and
the content of water is 1 to 64.5% by mass based on the whole composition.

2. The composition according to claim 1, wherein said amine is at least one compound selected from the group consisting of ethanolamine, N-methylethanolamine, and 2-(2-aminoethoxy)ethanol.

3. The composition according to claim 1, wherein said acid amide represented by formula (I) is at least one compound selected from the group consisting of N,N-dimethylisobutylamide and 2-hydroxy-N,N,2-trimethylpropaneamide.

4. The composition according to claim 1, which further comprises an acid amide other than said acid amides represented by formula (I).

5. The composition according to claim 4, wherein the content of the acid amide other than said acid amides represented by formula (I) is not more than 40% by mass based on the whole composition.

6. The composition according to claim 4, wherein the total content of said acid amide represented by formula (I) and the acid amide other than said acid amides of formula (I) is 30 to 70% by mass based on the whole composition.

7. The composition according to claim 1, wherein said saccharide or said sugar alcohol is at least one compound selected from the group consisting of glucose, mannose, galactose, sorbitol, mannitol, and xylitol.

8. A method for stripping a photoresist, the method comprising stripping a photoresist with a photoresist stripping agent composition according to any one of claims 1 to 7.

* * * * *